United States Patent [19]
Hoft et al.
[11] 3,747,023
[45] July 17, 1973

[54] VOLTAGE CONTROLLED CRYSTAL OSCILLATOR

[75] Inventors: Donald J. Hoft, Holliston; John B. Wallace, Southboro, both of Mass.
[73] Assignee: Raytheon Company, Lexington, Mass.

[22] Filed: June 1, 1971
[21] Appl. No.: 148,364
[52] U.S. Cl. .................. 332/26, 307/320, 331/36 C, 331/116 R, 331/177 V, 332/30 V
[51] Int. Cl. .................. H03c 3/28, H03c 3/22
[58] Field of Search .................. 332/26, 30 V; 331/116 R, 36 C, 177 V; 307/320

[56] References Cited

UNITED STATES PATENTS

| | | | |
|---|---|---|---|
| 3,571,754 | 3/1971 | Healey et al. | 331/177 V |
| 3,477,039 | 11/1969 | Chan | 331/116 R |
| 3,382,463 | 5/1968 | Hurtig | 331/116 R X |
| 3,382,462 | 5/1968 | Davis | 331/116 R X |
| 3,428,916 | 2/1969 | Hovenga et al. | 331/177 V X |
| 2,741,700 | 4/1956 | Hall | 332/26 X |
| 3,370,255 | 2/1968 | Brower et al. | 332/30 V X |
| 3,227,968 | 1/1966 | Brounley | 332/26 |

*Primary Examiner*—Alfred L. Brody
*Attorney*—Philip J. McFarland, Joseph D. Pannone and Richard M. Sharkansky

[57] ABSTRACT

A voltage-controlled crystal oscillator circuit for use in various kinds of electronic apparatus is shown. The preferred embodiment consists of voltage sensitive capacitor, as a varactor, in circuit with a crystal and a compensating tuned circuit, the latter being adjustable as desired to eliminate the effects of nonlinearity in the impedance characteristics of the crystal and the varactor as the voltage across the varactor is varied.

1 Claim, 5 Drawing Figures

INVENTORS
DONALD J. HOFT
JOHN B. WALLACE

VOLTAGE CONTROLLED CRYSTAL OSCILLATOR

The invention herein described was made in the course of or under a contract or subcontract thereunder, with the Department of Defense.

BACKGROUND OF THE INVENTION

It is a recurrent problem in the art satisfactorily to frequency modulate a carrier signal in a precise and predetermined manner. For example, in the field of radar, it is sometimes required that a CW radio frequency signal be repetitively modulated with a linearly varying modulation signal. The accuracy of operation of any radar using such a frequency modulated signal is dependent, to a large degree, on the precision at which the modulation signal is generated. Similarly, in the communication field when FM modulation signals corresponding to spoken words to be transmitted or received are to be generated, it is necessary, for the best operation, that such modulation signals precisely correspond to the frequencies in the spoken words to be transmitted or received. Additionally, in the field of mensuration of radio frequency signals, it is often necessary to provide a signal source having an output signal whose frequency may be varied precisely from a norm.

A so-called voltage controlled crystal oscillator (VCXO) may, if the deviation of the required modulation signal is relatively small, be used to effect frequency modulation in the mentioned applications. Thus, it is known that a voltage sensitive capacitor, as a varactor, may be disposed in circuit with a crystal oscillator to control the frequency thereof in accordance with a signal applied to the baractor. Unfortunately however, in known modulation circuits for radar applications, it is necessary (if modulation is to be precise) either to provide matched crystals and varactors and/or to shape the modulating signal to compensate for the inherent nonlinearity of the crystal-varactor combination. Whichever approach is used, it is evident that difficulty and expense is entailed in the selection of nonlinear elements having matched characteristics or in designing and fabricating signal shaping circuity.

Similar problems exist when it is desired to frequency modulate a carrier signal in the communication field, particularly when it is desired to modulate the output signal of a crystal oscillator with voice frequency signals. Obviously, unless the complex voice frequency signals are faithfully reproduced as modulation signals on the output signal of the crystal oscillator, distortion is experienced and performance of the system is degraded. To avoid such effects, it is necessary to eliminate, or compensate for, nonlinearity in a varactor/-crystal oscillator combination.

Still further, in the field of mensuration, the problem of frequency modulating a carrier signal to produce a signal at a known frequency is commonly encountered. One way in which the problem is met is to frequency modulate the output signal of a crystal oscillator circuit by changing the voltage across a varactor in such circuit to change the frequency of the output signal as desired. In order that such an approach be as efficacious as possible, it is necessary to eliminate, or compensate for, nonlinearity in the modulation circuitry.

SUMMARY OF THE INVENTION

Therefore, it is a primary object of this invention to provide an improved crystal oscillator circuit adapted to be frequency modulated, throughout a predetermined band of frequencies, in a linear manner and with a high degree of precision.

Another object of this invention is to provide an improved crystal oscillator circuit adopted to be frequency modulated, such circuit including a nonlinear modulating element and compensating means to eliminate, for all practical purposes, the effects of nonlinearity of such modulating means and the crystal oscillator.

Still another object of this invention is to provide an improved crystal oscillator circuit adapted to be frequency modulated in a linear fashion, such circuit including compensating means which are inexpensive to construct and simple to use.

These and other objects of this invention are attained genrally by providing, in parallel with a crystal oscillator in a voltage-controlled crystal oscillator circuit, a variable reactance, preferably an adjustable capacitor and an inductor, the sizes of the two parallel elements being such that, within a band of frequencies between the natural series and parallel resonance frequencies of the crystal oscillator, the reactance of such parallel elements counterbalances the reactance of the crystal oscillator and a voltage-controlled modulation element in circuit with such oscillator.

BRIEF DESCRIPTION OF THE DRAWINGS

For a more complete understanding of this invention reference is now made to the following description of various embodiments of this invention illustrated in the accompanying drawings, in which.

DESCRIPTION OF THE PREFERRED EMBODIMENT

Figure 1:
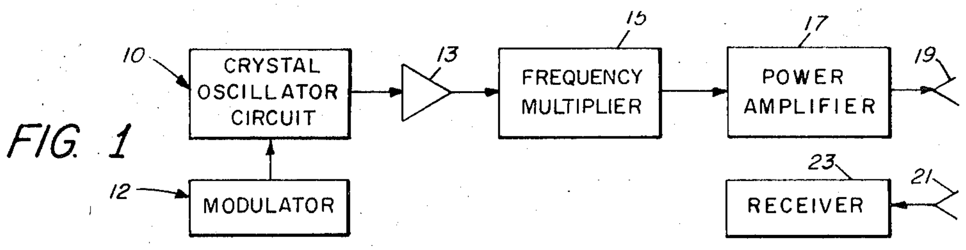
FIG. 1 is a block diagram, greatly simplified, of a radar system using a voltage-controlled crystal oscillator circuit as comtemplated by this invention.

Referring now to FIG. 1, it may be seen that the transmitter portion of a swept-frequency continuous wave (SFCW) radar according to this invention comprises a crystal oscillator circuit 10 and a modulator 12 (both of which are to be described in detail hereinafter), a buffer amplifier 13, a frequency multiplier 15, a power amplifier 17 and a transmitting antenna 19. The latter elements preferably are conventional in construction. Suffice it to say here that if, say, the crystal oscillator circuit 10 is designed to operate at, say, 25 MHz, the modulator 12 repetitively to produce a linear ramp signal at a 100 Hz rate (the deviation [peak to peak] of such ramp being 5 KHz) the frequency multiplier 15 to multiply its input signal by 128, then the radio frequency signal out of the antenna 19 is frequency modulated S-band signal having a deviation

[peak to peak] of 640 KHz. Upon reflection from targets (not shown), modulated radio frequency echo signals pass through receiving antenna 21 to a receiver 23 therein to be demodulated and utilized as desired.

Figure 2:
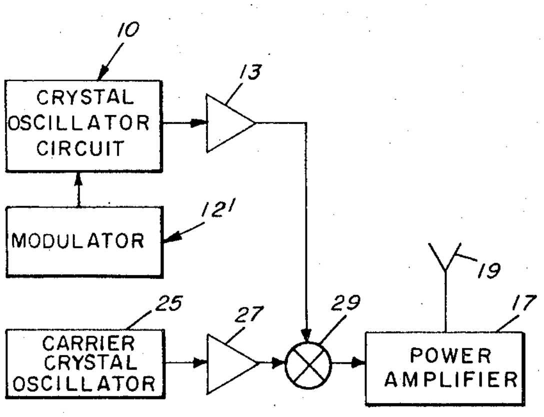
FIG. 2 is a block diagram, greatly simplified, of a communication transmitter using a voltage-controlled crystal oscillator as contemplated by this invention.

Referring now to FIG. 2 it may be seen that a communication transmitter according to this invention comprises a crystal oscillator circuit 10, a modulator 12', a buffer amplifier 13, a carrier crystal oscillator 25, a buffer amplifier 27, a mixer 29, a power amlifier 17 and an antenna 19. It is apparent, then, that the radio frequency signal out of the antenna 19 (assuming appropriate filtering of the signal out of the mixer 29) may be a radio frequency signal offset from the frequency of the carrier crystal oscillator by an amount equal to the frequency of the signal out of crystal oscillator circuit 10. Such frequency is, as will become clear hereinafter, the frequency of the crystal oscillator modulated by, say, voice frequency.

Figure 3:
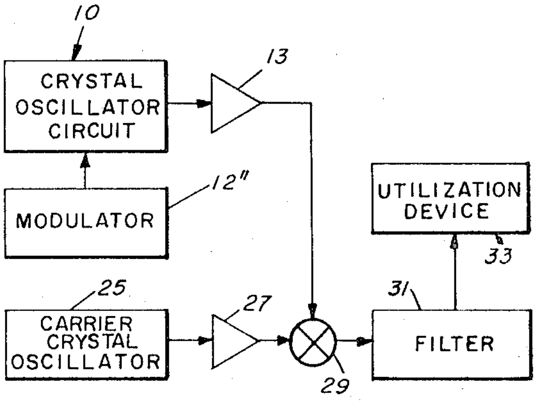
FIG. 3 is a block diagram, greatly simplified, of a variable frequency source using a voltage-controlled crystal oscillator as contemplated by this invention; and, FIG. 4 is a schematic diagram of a voltage-controlled crystal oscillator and a modulator as contemplated by this invention, such oscillator being adapted to be used in the embodiments shown in FIGS. 1, 2 and 3.

Referring now to FIG. 3, an adjustable radio frequency source according to this invention is shown, such source being similar in construction to the communication transmitter shown in FIG. 2, except that the modulator 12'' is modified (as explained hereinafter) and a radio frequency filter 31 is interposed between the mixer 29 and a utilization device 33. The latter may take any form, as for example, a radio frequency circuit whose frequency response is to be determined.

Figures 4, 5:
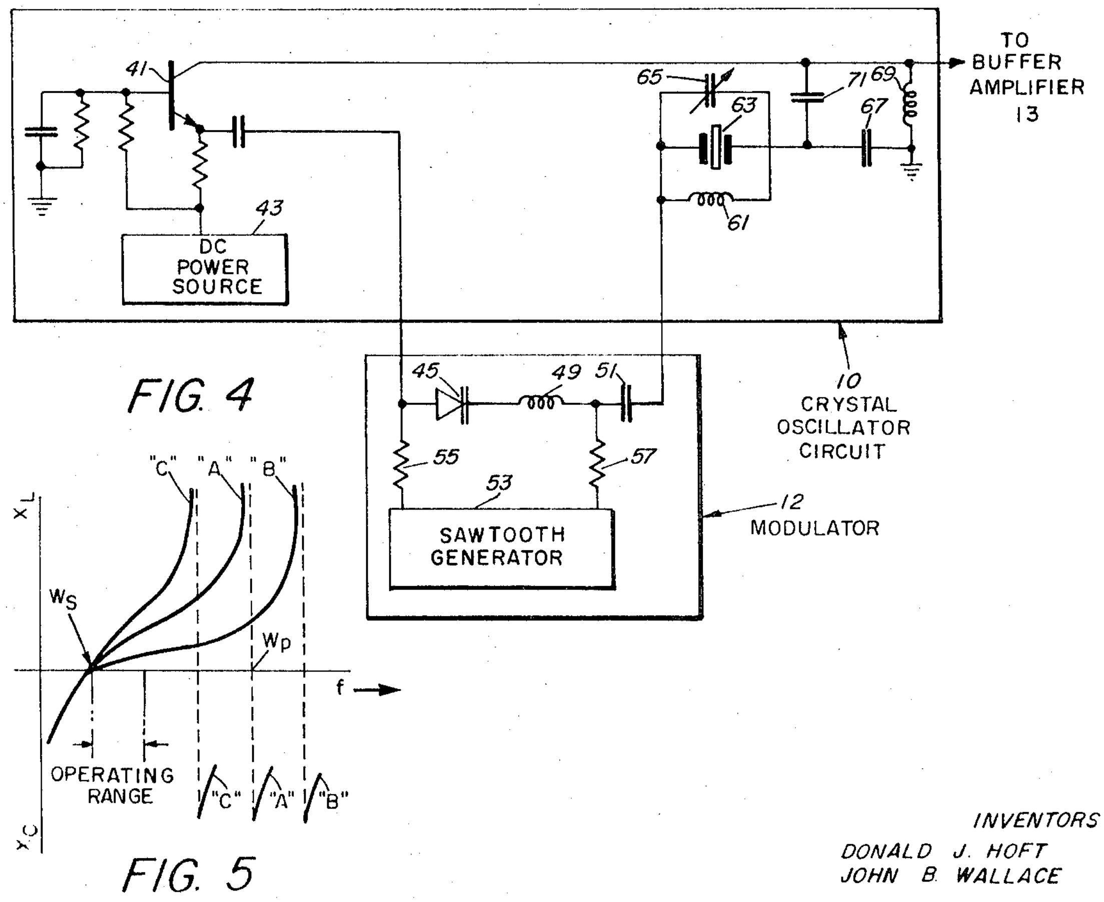
FIG. 5 is a diagram showing operation of the compensating tuned circuit in FIG. 4.

Referring now to FIG. 4, the details of the crystal oscillator circuit 10 adapted to be used in the embodiments shown in FIGS. 1, 2 and 3 and the modulator 12 for use in the embodiment shown in FIG. 1 are illustrated. Thus, the crystal oscillator circuit 12 includes a transistor 41 having its electrodes biased as shown from a DC source 43. The emitter electrode (not numbered) is connected through a capacitor to one terminal (not numbered) of the modulator 12. The latter here is made up of a varactor 45, an inductor 49 and a capacitor 51 serially connected between the terminals (not numbered) of the modulator 12. The voltage across the varactor 45 is varied repetitively (thereby to change the capacitance thereof) by a linear sawtooth signal out of a conventional sawtooth generator 53, such signal being applied through resistors 55, 57. The second terminal of the modulator 12 is connected to the parallel combination of an inductor 61, a crystal 63 and a variable capacitor 65. The second side of the just-mentioned parallel combination is connected through a serial-parallel combination, made up of a capacitor 67 and an inductor 69 and a capacitor 71, to the collector electrode (not numbered) of the transistor 41 and to an output terminal (not shown).

Considering first the crystal 63 alone, it will be recognized that that element may be considered to be, electrically, a series circuit made up of an inductance, "L," a capacitance, "C," and a resistance, "R," with a stray capacitance, "Co," in parallel across such series circuit. The magnitude of each element is, of course, dependent upon the particular crystal used. In a typical case, however, with an AT-cut crystal having a "Q" in the order of 35,000 to 40,000, the inductance "L" is in the order of 2.25 millihenries, the capacitance "C" is in the order of 0.018 picofarads, the resistance "R" is in the order of 10 ohms and the capacitance "Co" is in the order of 4 picofarads. At the natural resonance frequency of the crystal 63, sometimes referred to as Wp, the equivalent inductive and capacitive reactances (connected in parallel) are such as to cancel one another, i.e., the impedance of the crystal 63 is purely resistive. At another, lower frequency dependent upon the actual values of "L" and "C," the reactances of "L" and "C" are equal and opposite one to the other, i.e., there is a frequency, sometimes referred to as the series resonance, Ws, frequency, at which the impedance of the crystal 63 is also purely resistive. Between the two reasonance frequencies, the reactance of the crystal 63 is inductive, varying in a nonlinear manner.

The compensating tuned circuit made up of inductor 61 and capacitor 65 is so designed that it has, at the midpoint of the range of the capacitor 65, a resonance frequency (in combination with the capacitance Co) which is close to the parallel resonance frequency of the crystal 63. Therefore, the equivalent parallel reactance of the crystal 63 is changed resulting in a change in its parallel resonance frequency. The effect of the compensating tuned circuit is shown in FIG. 5, where curve "A" represents the reactance of the crystal 63 without any compensation, curve "B" represents the effective reactance of the crystal 63 when adjustable capacitor 65 is set at the midpoint of its range and curve "C" represents the effective reactance of the crystal 63 when adjustable capacitor 65 is changed to another point in its range. It may be seen, as shown in FIG. 5, that operation within a frequency range just above the series resonance frequency may be controlled so that operation occurs on a more linear portion of the impedance characteristic curve of the crystal 63. It will be obvious to one of skill in the art that the adjustable capacitor 65 may be adjusted to vary the parallel resonance frequency of the crystal 63 as desired (with a corresponding change in the shape of the impedance characteristic of the crystal 63). Further, it will be obvious that, because the varactor 45 appears to be a capacitor in series with the crystal 63, the compensating tuned circuit may be further adjusted so as to eliminate any nonlinearity in the response of the varactor 45 at the same time as the nonlinearity in the response of the crystal 63 is being eliminated.

The modulator 12' is quite similar to the modulator 12. The difference between the two is that the sawtooth generator 53 of modulator 12 is replaced by a conventional microphone and amplifying arrangement (not shown) to form modulator 12'. With such a change it is evident that the capacitance of the varactor 45 may be caused closely to follow voice signals from a microphone with any nonlinearity of the varactor's response being compensated as described hereinbefore.

In like manner, the modulator 12'' is quite similar to the modulator 12, differing in that the sawtooth generator 53 is replaced by a DC source and a calibrated resistor so that the voltage across the varactor 45 may be set at any desired level. Again, nonlinearity in the response of the varactor 45 is compensated as described hereinbefore.

Having described various preferred embodiments of a voltage-controlled crystal oscillator circuit, it will be evident that our invention may take other forms. For example, if it is desired to frequency shift key the apparatus shown in either FIG. 1 or FIG. 2, it would be obvious that appropriate modification could be made to the modulator to accomplish such end. It is felt, therefore, that our invention should not be restricted to its disclosed embodiments, but rather should be limited only by the spirit and scope of the appended claims.

What is claimed is: frequency modulated

1. In apparatus wherein a frequencymodulated continuous wave signal is produced, the characteristics of the modulation being controllable, the combination of:

a. a modulator network having a nonlinear reactance over a frequency range $f_1$ to $f_2$ for producing a frequency modulation signal, such modulator network including:

i. a varactor:

ii. means for linearly varying the voltage across the varactor to change the reactance of such varactor over the frequency range $f_1$ to $f_2$; and b. an oscillator network, for generating a continuous wave signal, such network having a nonlinear reactance over the frequency range $f_1$ to $f_2$, the frequency of the continuous wave signal being modulated over the frequency range $f_1$ to $f_2$ by the frequency modulated signal and being serially coupled to the varactor and including:

i. a crystal;

ii. an inductor disposed in parallel with the crystal; and, iii. a capacitor, disposed in parallel with the inductor, characterized in that the value of such capacitor is selected to shape the nonlinear reactance variation of the oscillator network over the frequency range $f_1$ to $f_2$ as a function of the nonlinear reactance variation of the modulator network to linearize the change in frequency of the continuous wave signal over the frequency range $f_1$ to $f_2$.

* * * * *